United States Patent
Genji

(10) Patent No.: US 10,886,894 B2
(45) Date of Patent: Jan. 5, 2021

(54) ACOUSTIC WAVE FILTER, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventor: Takuma Genji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/910,228

(22) Filed: Jun. 24, 2020

(65) Prior Publication Data

US 2020/0321941 A1    Oct. 8, 2020

Related U.S. Application Data

(63) Continuation of application No. PCT/JP2018/047318, filed on Dec. 21, 2018.

(30) Foreign Application Priority Data

Dec. 27, 2017 (JP) ................................. 2017-251260

(51) Int. Cl.
*H03H 9/64* (2006.01)
*H03H 9/145* (2006.01)
(Continued)

(52) U.S. Cl.
CPC ................ *H03H 9/64* (2013.01); *H03F 3/19* (2013.01); *H03H 9/14538* (2013.01);
(Continued)

(58) Field of Classification Search
CPC combination set(s) only.
See application file for complete search history.

(56) References Cited

U.S. PATENT DOCUMENTS

| 6,265,808 B1* | 7/2001 | Taniguchi | H03H 9/25 |
| | | | 310/313 B |
| 2003/0111931 A1* | 6/2003 | Suzuki | H03H 9/6483 |
| | | | 310/313 D |

(Continued)

FOREIGN PATENT DOCUMENTS

| JP | 5765502 B1 | 8/2015 |
| JP | 2017-092945 A | 5/2017 |

(Continued)

OTHER PUBLICATIONS

Official Communication issued in International Patent Application No. PCT/JP2018/047318, dated Mar. 5, 2019.

*Primary Examiner* — Ganiyu A Hanidu
(74) *Attorney, Agent, or Firm* — Keating & Bennett, LLP

(57) ABSTRACT

An acoustic wave filter includes a substrate having piezoelectricity, input/output terminals on the substrate, ground terminals on the substrate and separated from each other, and a longitudinally coupled resonator on the substrate and arranged on a path connecting the input/output terminals, in which each of IDT electrodes included in the longitudinally coupled resonator includes a pair of comb-shaped electrodes each of which is provided with a plurality of electrode fingers and a busbar electrode, the other of the pair of the comb-shaped electrodes included in the IDT electrode arranged at a position closest to the input/output terminal is connected to the ground terminal on the substrate, and the other of the pair of comb-shaped electrodes included in each of all the IDT electrodes other than the IDT electrode is connected to the ground terminal on the substrate.

14 Claims, 11 Drawing Sheets

(51) Int. Cl.
*H03H 9/25* (2006.01)
*H03F 3/19* (2006.01)
*H04B 1/40* (2015.01)
*H03H 9/72* (2006.01)
*H04B 1/00* (2006.01)

(52) U.S. Cl.
CPC ............... *H03H 9/25* (2013.01); *H03H 9/72* (2013.01); *H04B 1/0057* (2013.01); *H04B 1/40* (2013.01); *H03F 2200/451* (2013.01)

(56) References Cited

U.S. PATENT DOCUMENTS

| | | | |
|---|---|---|---|
| 2007/0024392 A1* | 2/2007 | Inoue ................... | H03H 9/6423 |
| | | | 333/133 |
| 2016/0173062 A1* | 6/2016 | Takamine ............ | H03H 9/6479 |
| | | | 333/133 |
| 2017/0099043 A1 | 4/2017 | Goto et al. | |
| 2017/0099044 A1* | 4/2017 | Takamine ............ | H03H 9/1092 |
| 2017/0279433 A1* | 9/2017 | Matsukura ............... | H03H 3/04 |
| 2018/0062604 A1* | 3/2018 | Koskela .................. | H03H 3/08 |

FOREIGN PATENT DOCUMENTS

| | | |
|---|---|---|
| WO | 2016/013330 A1 | 1/2016 |
| WO | 2017/208629 A1 | 12/2017 |

\* cited by examiner

ACOUSTIC WAVE FILTER, MULTIPLEXER, RADIO FREQUENCY FRONT-END CIRCUIT, AND COMMUNICATION DEVICE

CROSS REFERENCE TO RELATED APPLICATIONS

This application claims the benefit of priority to Japanese Patent Application No. 2017-251260 filed on Dec. 27, 2017 and is a Continuation Application of PCT Application No. PCT/JP2018/047318 filed on Dec. 21, 2018. The entire contents of each application are hereby incorporated herein by reference.

BACKGROUND OF THE INVENTION

1. Field of the Invention

The present invention relates to an acoustic wave filter, a multiplexer, a radio frequency front-end circuit, and a communication device.

2. Description of the Related Art

An existing acoustic wave filter, such as a longitudinally coupled resonator surface acoustic wave (SAW) filter or a ladder SAW filter, has been used in a communication device such as a mobile phone. With the progress of communication devices supporting multi-band operation in recent years, an acoustic wave filter has been increasingly required not only to reduce an insertion loss in a communication band but also to improve an attenuation outside the communication band.

Japanese Patent No. 5765502 discloses a configuration of a SAW filter including a longitudinally coupled resonator formed of five interdigital transducer (IDT) electrodes as a reception-side filter of a duplexer. The five IDT electrodes configuring the longitudinally coupled resonator are commonly connected to one ground terminal on a piezoelectric substrate to strengthen the ground, and a coupling capacitance is provided between the reception-side filter and a transmission-side filter, so that an out-of-band attenuation in a vicinity of a pass band can be secured.

In the reception-side filter disclosed in Japanese Patent No. 5765502, it is not possible to improve a spurious response that is on a higher frequency side than a pass band and that is generated due to a resonant mode of the longitudinally coupled resonator. For this reason, in some cases, the attenuation cannot be sufficiently secured on the higher frequency side than the pass band of the reception-side filter.

Further, when the reception-side filter and another filter are applied to a multiplexer, and the spurious response is generated in a pass band of the other filter that is positioned on the higher frequency side than the pass band of the reception-side filter, there is a problem that bandpass characteristics of the other filter are degraded.

SUMMARY OF THE INVENTION

Preferred embodiments of the present invention provide acoustic wave filters, multiplexers, radio frequency front-end circuits, and communication devices in each of which an attenuation in a vicinity of a high frequency side of a pass band is improved.

An acoustic wave filter according to a preferred embodiment of the present invention includes a substrate having piezoelectricity, a first input/output terminal and a second input/output terminal on the substrate, a first ground terminal and a second ground terminal on the substrate and separated from each other, and a longitudinally coupled resonator on the substrate and arranged on a path connecting the first input/output terminal and the second input/output terminal, in which the longitudinally coupled resonator includes three or more Interdigital Transducer (IDT) electrodes arranged side by side in a direction in which a predetermined acoustic wave propagates on the substrate, each of the three or more IDT electrodes includes a pair of comb-shaped electrodes each of which includes a plurality of electrode fingers extending in an intersecting direction that intersects the direction and a busbar electrode connecting one end of each of the electrode fingers of the plurality of electrode fingers with each other, the pair of comb-shaped electrodes oppose each other such that the plurality of electrode fingers are interdigitated with each other, and one of the pair of the comb-shaped electrodes is connected to the path, the other of the pair of the comb-shaped electrodes included in a first IDT electrode being an IDT electrode arranged at a position closest to the second input/output terminal among the three or more IDT electrodes is connected to the second ground terminal on the substrate, and another of the pair of comb-shaped electrodes included in each the IDT electrodes other than the first IDT electrode among the three or more IDT electrodes is connected to the first ground terminal on the substrate.

The inventor of preferred embodiments of the present invention discovered that in an acoustic wave filter including an existing longitudinally coupled resonator, a spurious response caused by a resonant mode of the longitudinally coupled resonator occurs on a higher frequency side than a pass band. For this reason, there is a problem that an attenuation on the higher frequency side than the pass band cannot be ensured only by simply making the ground of a plurality of IDT electrodes of the longitudinally coupled resonator common. Moreover, in particular, when the ground of the plurality of IDT electrodes is intended to be made common in a vicinity of an input/output terminal, it is assumed that a signal wiring and a ground wiring connected to the input/output terminal are close to each other and overlap with each other. Therefore, the low loss and the high attenuation of a signal are not ensured.

On the other hand, according to the above-described configuration, the ground terminal of the first IDT electrode closest to the second input/output terminal among the plurality of IDT electrodes of the longitudinally coupled resonator is separated from the ground terminal of the other IDT electrodes, and the ground terminal of the other IDT electrodes is made common. By separating the ground terminal of the first IDT electrode from the ground terminal of the other IDT electrodes, an inductance value between the longitudinally coupled resonator and the ground is able to be effectively increased, and an attenuation pole that is on a higher frequency side than a pass band and that is generated due to the longitudinally coupled resonator can be shifted to a lower frequency side. This makes it possible to improve the attenuation in a vicinity on the high frequency side of the pass band of the acoustic wave filter.

Further, one of the pair of comb-shaped electrodes included in the first IDT electrode may be connected to a path on a side of the first input/output terminal of the first input/output terminal and the second input/output terminal, and a wiring connecting one of the pair of comb-shaped electrodes included in a second electrode being an IDT electrode arranged at a position next closest to the second input/output terminal and subsequent to the first IDT electrode among the three or more IDT electrodes and the second input/output terminal may not be overlapped with a wiring connecting the other of the pair of comb-shaped electrodes included in the first IDT electrode and the second ground terminal, and a wiring connecting the other of the pair of comb-shaped electrodes included in each of the IDT electrodes other than the first IDT electrode among the three or more IDT electrodes and the first ground terminal.

According to the above features, the wiring connecting the second IDT electrode and the second input/output terminal does not need to have a three-dimensional wiring structure with respect to the wiring connecting the first IDT electrode and the second ground terminal, and the wiring connecting the IDT electrodes other than the first IDT electrode and the first ground terminal, with a dielectric film interposed therebetween. Therefore, it is possible to reduce a parasitic capacitance of the wiring that propagates a radio frequency signal in a vicinity of the second input/output terminal, and thus it is possible to effectively improve an insertion loss in the pass band of the acoustic wave filter.

Additionally, the acoustic wave filter may further include one or more series arm resonators arranged on the path, and one or more parallel arm resonators between a node on the path and a ground.

Accordingly, in the acoustic wave filter in which a trap resonator to define an attenuation pole outside the pass band is added, it is possible to improve the attenuation in the vicinity on the high frequency side of the pass band that is adjacent to the longitudinally coupled resonator.

Also, a multiplexer according to a preferred embodiment of the present invention includes a common terminal, a first terminal and a second terminal, a first filter connected between the common terminal and the first terminal, and a second filter connected between the common terminal and the second terminal, in which the first filter is an acoustic wave filter according to a preferred embodiment of the present invention, and a pass band of the second filter is positioned on a higher frequency side than a pass band of the first filter.

It is assumed that bandpass characteristics of the second filter deteriorates due to a fact that a spurious response that is caused by the longitudinally coupled resonator and that occurs on the higher frequency side than the pass band of the first filter is positioned within the pass band of the second filter. Even in this case, with the first filter being an acoustic wave filter according to a preferred embodiment of the present invention, it is possible to improve the attenuation in the vicinity on the high frequency side of the pass band of the first filter by shifting the attenuation pole on the higher frequency side than the pass band of the first filter to the lower frequency side. This makes it possible to reduce or prevent degradation of the bandpass characteristics of the second filter and degradation of isolation between the first filter and the second filter, and to improve the bandpass characteristics of the multiplexer.

The second filter may be a transmission-side filter on the substrate, the first filter may be a reception-side filter, the common terminal may be the first input/output terminal, and the first terminal may be the second input/output terminal.

Generally, an acoustic wave filter with a longitudinally coupled resonator is applied as a reception-side filter. Although the acoustic wave filter with the longitudinally coupled resonator generates the spurious response as described above on the higher frequency side than the pass band, and therefore, it is difficult to secure the attenuation on the higher frequency side, when a multiplexer is configured, a pass band of a reception-side filter is generally positioned on a higher frequency side than a pass band of a transmission-side filter in many cases, and therefore, there is no problem.

However, in the multiplexer, the pass band of the transmission-side filter may be positioned on the higher frequency side with respect to the pass band of the reception-side filter. Even in this case, since the first filter is improved in attenuation on the higher frequency side than the pass band, the first filter can be applied as a filter on a lower frequency side in a case of configuring the multiplexer.

In addition, a radio frequency front-end circuit according to a preferred embodiment of the present invention includes a multiplexer according to a preferred embodiment of the present invention, and an amplifier circuit connected to the multiplexer.

Thus, it is possible to improve the attenuation in the vicinity on the high frequency side of the pass band of the first filter, and to reduce or prevent the deterioration of the bandpass characteristics of the second filter, so that it is possible to provide a radio frequency front-end circuit in which bandpass characteristics of the multiplexer are improved.

In addition, a communication device according to a preferred embodiment of the present invention includes a Radio Frequency (RF) signal processing circuit to process a radio frequency signal to be transmitted and received with an antenna element, and a radio frequency front-end circuit according to a preferred embodiment of the present invention configured to transfer the radio frequency signal between the antenna element and the RF signal processing circuit.

Thus, it is possible to improve the attenuation in the vicinity on the high frequency side of the pass band of the first filter, and to reduce or prevent the deterioration of the bandpass characteristics of the second filter, so that it is possible to provide the communication device in which bandpass characteristics of the multiplexer are improved.

According to the acoustic wave filters, the multiplexers, the radio frequency front-end circuits, and the communication devices according to preferred embodiments of the present invention, it is possible to improve the attenuation in the vicinity on the high frequency side of the pass band of the acoustic wave filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
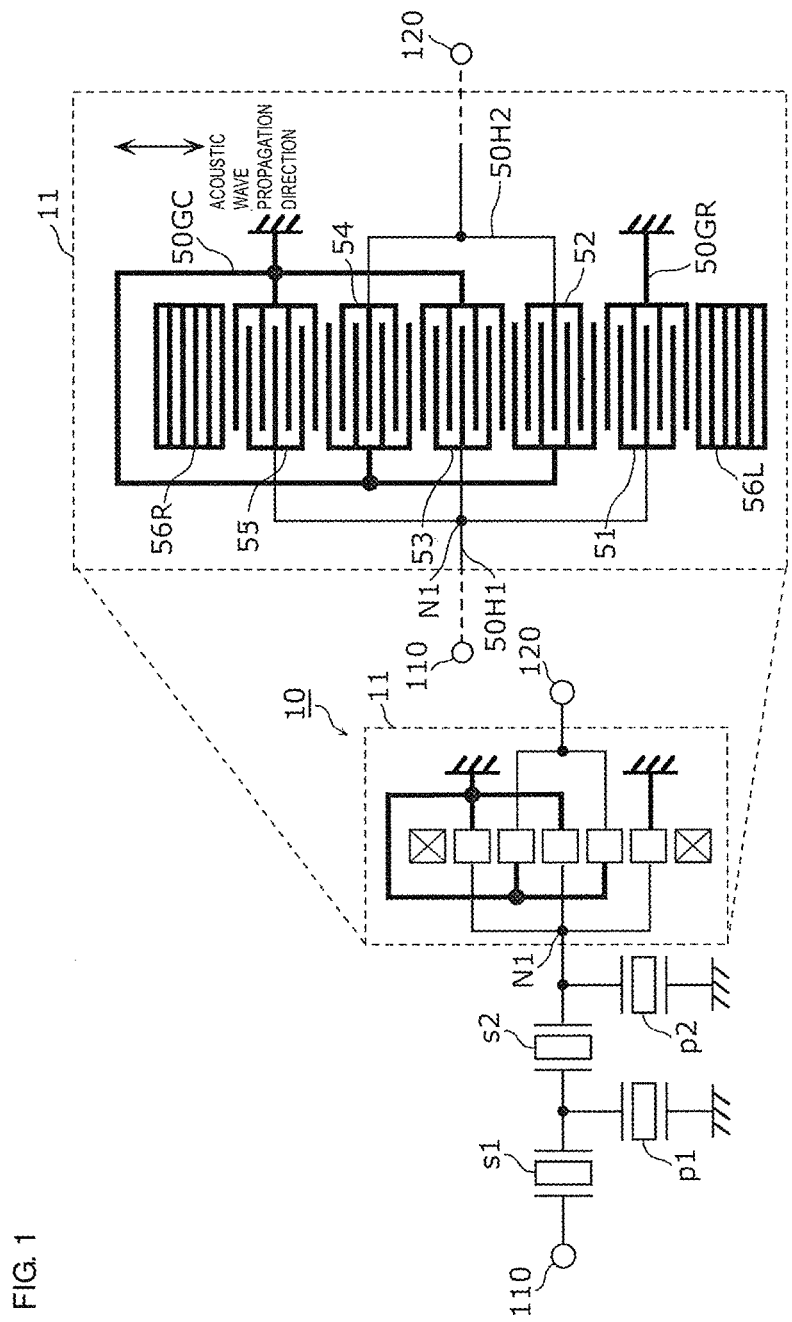
FIG. 1 is a circuit configuration diagram of an acoustic wave filter according to a first preferred embodiment of the present invention.

Hereinafter, preferred embodiments of the present invention will be described in detail with reference to the accompanying drawings. All of the preferred embodiments described below represent general or specific examples. The numerical values, shapes, materials, elements, arrangement and connection configurations of the elements, and the like shown in the following preferred embodiments are mere examples and are not intended to limit the present invention. Among the elements in the following preferred embodiments, elements that are not described in the independent claims are described as optional elements. In addition, the sizes of the elements or the ratios of the sizes illustrated in the drawings are not necessarily strict.

First Preferred Embodiment 1-1. Configuration of Acoustic Wave Filter 10

FIG. 1 is a circuit configuration diagram of an acoustic wave filter 10 according to a first preferred embodiment of the present invention. As illustrated in FIG. 1, the acoustic wave filter 10 includes a longitudinally coupled resonator 11, series arm resonators s1 and s2, parallel arm resonators p1 and p2, and input/output terminals 110 and 120.

The longitudinally coupled resonator 11 is preferably arranged on a path connecting the input/output terminal 110 (first input/output terminal) and the input/output terminal 120 (second input/output terminal), and includes interdigital transducer (IDT) electrodes 51, 52, 53, 54, and 55 and reflectors 56L and 56R that are adjacent to each other in an acoustic wave propagation direction.

Each of the IDT electrodes 51 to 55 includes a pair of comb-shaped electrodes including a plurality of electrode fingers extending in a direction intersecting with the acoustic wave propagation direction and a busbar electrode connecting one end of each of the electrode fingers of the plurality of electrode fingers to each other. The pair of comb-shaped electrodes oppose each other such that the plurality of electrode fingers are interdigitated with each other.

The IDT electrodes 51 to 55 and the reflectors 56L and 56R are arranged in an order of the reflector 56L, the IDT electrodes 51, 52, 53, 54, and 55, and the reflector 56R in the acoustic wave propagation direction. The busbar electrode of one of the pair of comb-shaped electrodes included in each of the IDT electrodes 51, 53, and 55 and the busbar electrode of the other of the pair of comb-shaped electrodes included in each of the IDT electrodes 52 and 54 are arranged on a side of the input/output terminal 110 of the input/output terminals 110 and 120. Further, the busbar electrode of the other of the pair of comb-shaped electrodes included in each of the IDT electrodes 51, 53, and 55 and the busbar electrode of one of the pair of comb-shaped electrodes included in each of the IDT electrodes 52 and 54 are arranged on a side of the input/output terminal 120 of the input/output terminals 110 and 120.

In each of the IDT electrodes 51 to 55, one of the pair of comb-shaped electrodes is connected to a signal wiring 50H1 or 50H2 on the path connecting the input/output terminal 110 and the input/output terminal 120, and the other of the pair of comb-shaped electrodes is connected to a ground wiring 50GC or 50GR. More specifically, one of the pair of comb-shaped electrodes included in each of the IDT electrodes 51, 53, and 55 arranged at odd-numbered positions from a side of the reflector 56L is connected to the signal wiring 50H1 on a side of the input/output terminal 110, of the signal wiring 50H1 or 50H2. Further, one of the pair of comb-shaped electrodes included in each of the IDT electrodes 52 and 54 arranged at even-numbered positions from a side of the reflector 56L is connected to the signal wiring 50H2 on a side of the input/output terminal 120, of the signal wiring 50H1 or 50H2. Further, the other of the pair of comb-shaped electrodes included in each of the IDT electrodes 52, 53, 54, and 55 is connected to the ground wiring 50GC. Further, the other of the pair of comb-shaped electrodes included in the IDT electrode 51 is connected to the ground wiring 50GR.

With the above-described configuration, the longitudinally coupled resonator 11 mainly defines an insertion loss in a pass band of the acoustic wave filter 10 and an attenuation in a vicinity of the pass band.

Note that the number of IDT electrodes defining the longitudinally coupled resonator 11 is not limited to five, and may be equal to or more than three, for example.

The series arm resonators s1 and s2 are preferably acoustic wave resonators arranged on the path connecting the input/output terminal 110 and the input/output terminal 120.

The parallel arm resonators p1 and p2 are preferably acoustic wave resonators arranged between a node on the path and a ground.

The series arm resonators s1 and s2 and the parallel arm resonators p1 and p2 mainly improve the attenuation in a specific attenuation band of the acoustic wave filter 10.

Note that the number of the series arm resonators may be one or may be zero, for example. Similarly, the number of parallel arm resonators may be one or may be zero, for example. Further, each of the series arm resonators s1 and s2 and the parallel arm resonators p1 and p2 is arranged on the side of the input/output terminal 110 of the longitudinally coupled resonator 11, but may be arranged on the side of the input/output terminal 120.

Hereinafter, a structure of an acoustic wave resonator that defines the acoustic wave filter 10 will be described.

Figure 2A:
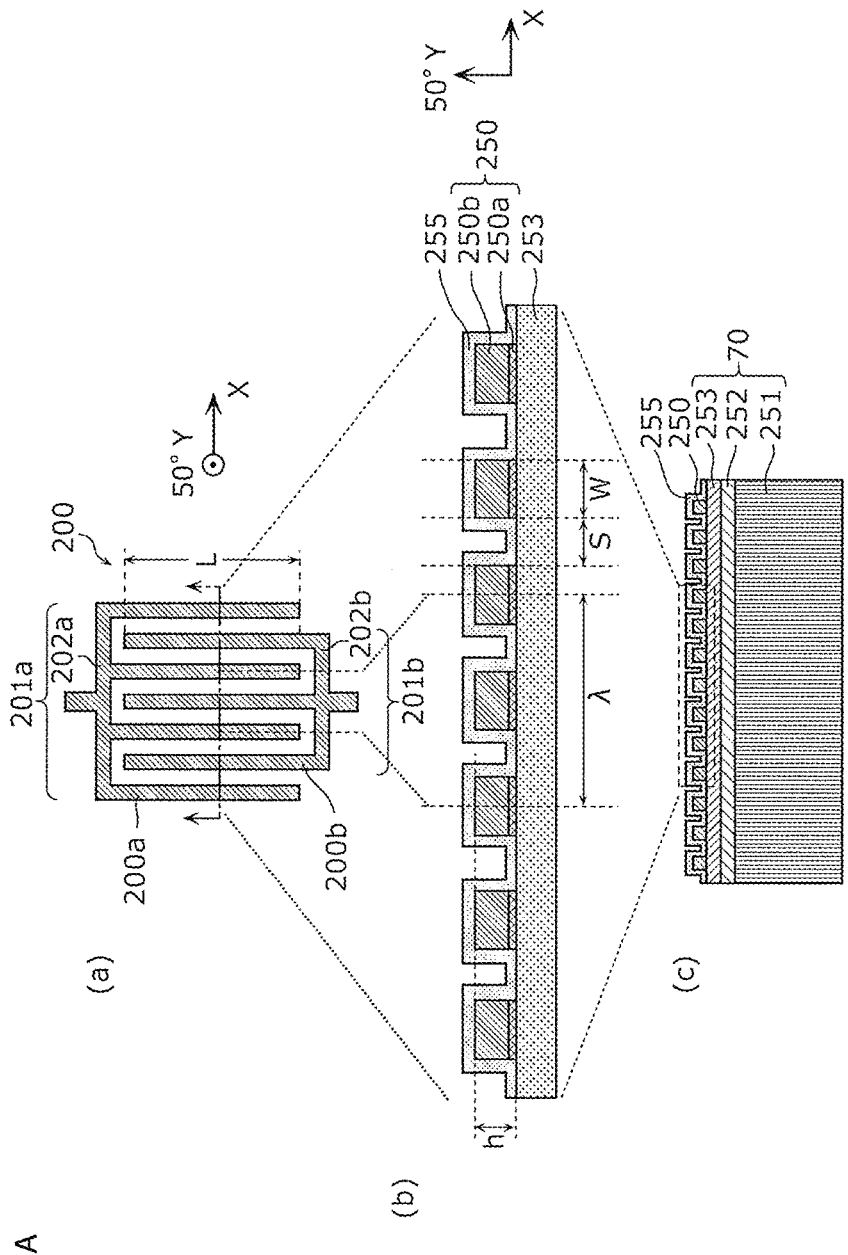
FIG. 2A is a plan view and a cross-sectional view schematically illustrating an example of the acoustic wave resonator according to the first preferred embodiment of the present invention.

FIG. 2A is a schematic view schematically illustrating an example of the acoustic wave resonator that defines an acoustic wave filter according to the present preferred embodiment, and part (a) is a plan view and parts (b) and (c) are cross-sectional views taken along a dashed-dotted line illustrated in part (a). FIG. 2A illustrates a schematic plan view and schematic cross-sectional views illustrating a structure of a longitudinally coupled resonator, a series arm resonator, and a parallel arm resonator that configure the acoustic wave filter 10. Note that an acoustic wave resonator 200 illustrated in FIG. 2A describes a typical structure of an IDT electrode defining the longitudinally coupled resonator 11, an IDT electrode defining the series arm resonators s1 and s2, and an IDT electrode defining the parallel arm resonators p1 and p2, and the number, length, and electrode finger pitch of electrode fingers defining an electrode are not limited to the configuration illustrated in FIG. 2A.

The acoustic wave resonator 200 includes a substrate 70 having piezoelectricity and comb-shaped electrodes 201a and 201b.

As illustrated in part (a) of FIG. 2A, the pair of comb-shaped electrodes 201a and 201b opposing each other are provided on the substrate 70. The comb-shaped electrode 201a includes a plurality of electrode fingers 200a that are parallel or substantially parallel to each other and a busbar electrode 202a that connects one end of each of the plurality of electrode fingers 200a to each other. The comb-shaped electrode 201b includes a plurality of electrode fingers 200b that are parallel or substantially parallel to each other and a busbar electrode 200b that connects one end of each of the plurality of electrode fingers 202b to each other. The plurality of electrode fingers 200a and the plurality of electrode fingers 200b are arranged along a direction orthogonal or substantially orthogonal to the acoustic wave propagation direction (X-axis direction).

Additionally, as illustrated in part (b) of FIG. 2A, an IDT electrode 250 including the plurality of electrode fingers 200a and 200b and the busbar electrodes 202a and 202b preferably have a laminated structure including a close contact layer 250a and a main electrode layer 250b.

The close contact layer 250a is a layer that improves close contact between the substrate 70 and the main electrode layer 250b, and for example, Ti is preferably used as a material. A film thickness of the close contact layer 250a is preferably, for example, about 12 nm.

For the main electrode layer 250b, for example, Al including 1% Cu is preferably used as a material. A film thickness of the main electrode layer 250b is preferably, for example, about 162 nm.

A protective layer 255 preferably covers the comb-shaped electrodes 201a and 201b. The protective layer 255 is a layer that protects the main electrode layer 250b from the external environment, adjusts frequency temperature characteristics, and improves moisture resistance, and is preferably, for example, a dielectric film including silicon dioxide as a main component. The protective layer 255 preferably has a thickness of, for example, about 25 nm.

Note that materials of the close contact layer 250a, the main electrode layer 250b, and the protective layer 255 are not limited to those described above. Further, the IDT electrode 250 may not have the laminated structure. The IDT electrode 250 may be made of, for example, a metal or an alloy such as Ti, Al, Cu, Pt, Au, Ag, or Pd, or may be made of a plurality of multilayer bodies made of the above-described metal or alloy. Further, the protective layer 255 may not be formed.

Next, the laminated structure of the substrate 70 will be described.

As illustrated in part (c) of FIG. 2A, the substrate 70 preferably includes a high acoustic velocity support substrate 251, a low acoustic velocity film 252, and a piezoelectric film 253, and has a structure in which the high acoustic velocity support substrate 251, the low acoustic velocity film 252, and the piezoelectric film 253 are laminated in this order.

The piezoelectric film 253 is preferably made of a 50° Y-cut X-propagation $LiTaO_3$ piezoelectric single crystal or piezoelectric ceramics (a lithium tantalate single crystal or ceramics cut along a plane having a normal line that is an axis rotated by about 50° from an Y-axis with an X-axis as a central axis, and the single crystal or the ceramics in which an acoustic surface wave propagates in the X-axis direction). The piezoelectric film 253 preferably has, for example, a thickness of about 600 nm. Note that, depending on required specifications for each filter, a material and cut-angles of the piezoelectric single crystal to be used as the piezoelectric film 253 are appropriately selected.

The high acoustic velocity support substrate 251 is a substrate that supports the low acoustic velocity film 252, the piezoelectric film 253, and the IDT electrode 250. Further, the high acoustic velocity support substrate 251 is preferably a substrate in which an acoustic velocity of a bulk wave in the high acoustic velocity support substrate 251 becomes higher than those of acoustic waves such as a surface acoustic wave and a boundary acoustic wave propagating through the piezoelectric film 253, and functions to confine the surface acoustic wave to a portion where the piezoelectric film 253 and the low acoustic velocity film 252 are laminated to prevent the surface acoustic wave from leaking below the high acoustic velocity support substrate 251. The high acoustic velocity support substrate 251 is preferably, for example, a silicon substrate, and preferably has a thickness of, for example, about 200 μm.

The low acoustic velocity film 252 is a film in which an acoustic velocity of a bulk wave in the low acoustic velocity film 252 is lower than that of the bulk wave propagating through the piezoelectric film 253, and is arranged between the piezoelectric film 253 and the high acoustic velocity support substrate 251. This structure and essential properties of energy concentration of acoustic waves in a medium having a low acoustic velocity reduce leakage of a surface acoustic wave energy to the outside of an IDT electrode. The low acoustic velocity film 252 is preferably, for example, a film including silicon dioxide as a main component, and preferably has a thickness of, for example, about 670 nm.

Note that, according to the laminated structure of the substrate 70, it is possible to significantly increase a Q value at a resonant frequency and an anti-resonant frequency as compared to an existing structure in which a piezoelectric substrate is used as a single layer. That is, since an acoustic wave resonator having a high Q value can be configured, it is possible to configure a filter having a small insertion loss by using the acoustic wave resonator.

Note that the high acoustic velocity support substrate 251 may have a structure in which a support substrate and a high acoustic velocity film in which the acoustic velocity of the propagating bulk wave is higher than those of the acoustic waves such as the surface acoustic wave and the boundary acoustic wave propagating through the piezoelectric film 253 are laminated. In this case, a piezoelectric material such as, for example, lithium tantalate, lithium niobate, or crystal, a dielectric material such as various ceramics such as alumina, magnesia, silicon nitride, aluminum nitride, silicon carbide, zirconia, cordierite, mullite, steatite, or forsterite, sapphire, or glass, a semiconductor such as silicon, or gallium nitride, a resin substrate, or the like can preferably be used for the support substrate. Also, various high acoustic velocity materials such as, for example, aluminum nitride, aluminum oxide, silicon carbide, silicon nitride, silicon oxynitride, a DLC film, or diamond, a medium including the above-mentioned material as a main component, and a medium including a mixture of the materials as a main component, or the like can preferably be used for the high acoustic velocity film.

Figure 2B:
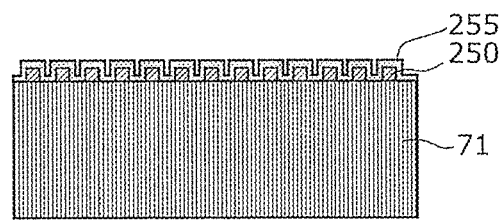
FIG. 2B is a cross-sectional view schematically illustrating an acoustic wave resonator according to a first modification of the first preferred embodiment of the present invention.

In addition, FIG. 2B is a cross-sectional view schematically illustrating an acoustic wave resonator according to a first modification of the first preferred embodiment. In the acoustic wave resonator 200 illustrated in FIG. 2A, an example in which the IDT electrode 250 is provided on the substrate 70 including the piezoelectric film 253 has been described, but the substrate on which the IDT electrode 250 is provided may be a piezoelectric single crystal substrate 71 including a single layer of a piezoelectric layer as illustrated in FIG. 2B. The piezoelectric single crystal substrate 71 is preferably made of, for example, a piezoelectric single crystal of $LiNbO_3$. The acoustic wave resonator 200 according to the present modification preferably includes the piezoelectric single crystal substrate 71 of $LiNbO_3$, the IDT electrode 250, and the protective layer 255 on the piezoelectric single crystal substrate 71 and the IDT electrode 250.

The piezoelectric film 253 and the piezoelectric single crystal substrate 71 described above may appropriately change the laminated structure, the material, the cut-angles, and the thickness according to required bandpass characteristics and the like of the acoustic wave filter 10. Even in the acoustic wave resonator 200 using a $LiTaO_3$ piezoelectric substrate or the like and having cut-angles other than the cut-angles described above, the same or similar advantageous effects to those of the acoustic wave resonator 200 using the piezoelectric film 253 described above can be obtained.

Here, an example of electrode parameters of the IDT electrodes defining the acoustic wave resonator will be described.

A wavelength of the acoustic wave resonator is defined by a wavelength $\lambda$ which is a repetition period of the plurality of electrode fingers 200a or the plurality of electrode fingers 200b configuring the IDT electrode 250 illustrated in FIG. 2A (b). The electrode finger pitch is ½ of the wavelength $\lambda$, and is defined as (W+S) when a line width of each of the electrode fingers 200a and 200b configuring the comb-shaped electrodes 201a and 201b is defined as W, and a space width between the electrode finger 200a and the electrode finger 200b adjacent to each other is defined as S. Additionally, as illustrated in FIG. 2A (a), an cross width L of one pair of comb-shaped electrodes 201a and 201b is an overlapping electrode finger length in a view from the acoustic wave propagation direction (X-axis direction) of the electrode finger 200a and the electrode finger 200b. Further, an electrode duty ratio of each acoustic wave resonator is a line width occupancy of the plurality of electrode fingers 200a and 200b, and is a ratio of the line width to an added value of the line width and the space width of the plurality of electrode fingers 200a and 200b, and is defined by W/(W+S). In addition, a height of the comb-shaped electrodes 201a and 201b, that is, a film thickness, is defined as h. Parameters for determining a shape and a size of the IDT electrode of the acoustic wave resonator such as the wavelength $\lambda$, the cross width L, the electrode duty ratio, and the film thickness h of the IDT electrode 250 described above are referred to as electrode parameters.

Figure 3A:
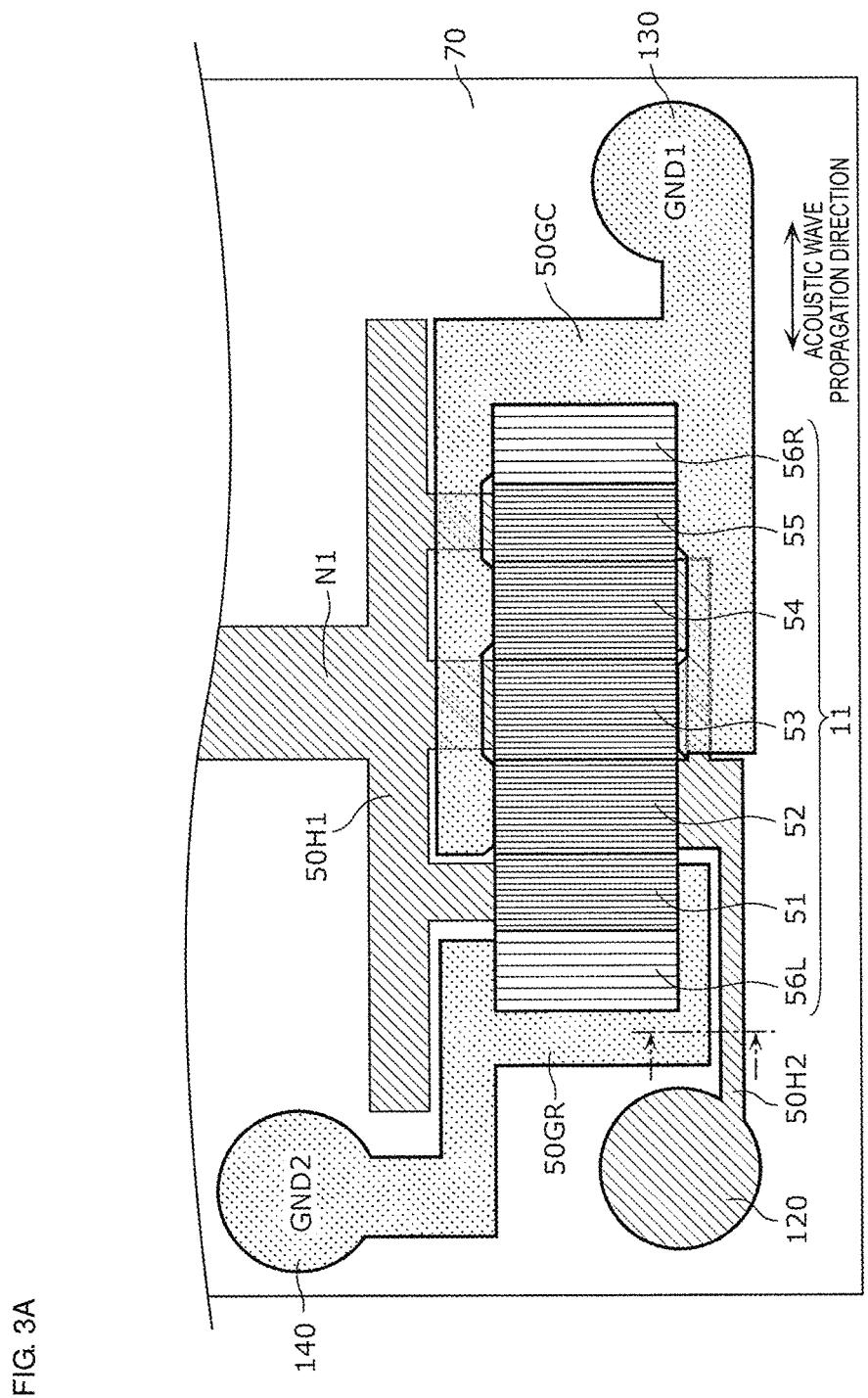
FIG. 3A is a plan view illustrating an electrode layout of a longitudinally coupled resonator of the acoustic wave filter according to the first preferred embodiment of the present invention.
Figure 3B:
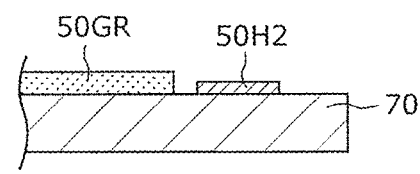
FIG. 3B is a cross-sectional view in a vicinity of an input/output terminal of the acoustic wave filter according to the first preferred embodiment of the present invention.

FIG. 3A is a plan view illustrating an electrode layout of the longitudinally coupled resonator 11 of the acoustic wave filter 10 according to the first preferred embodiment. FIG. 3B is a cross-sectional view in a vicinity of the input/output terminal 120 of the acoustic wave filter 10 according to the first preferred embodiment.

FIG. 3A illustrates the electrode layout of the longitudinally coupled resonator 11 defining the acoustic wave filter 10. As illustrated in FIG. 3A, the acoustic wave filter 10 includes the substrate 70 having piezoelectricity, and the longitudinally coupled resonator 11, the series arm resonators s1 and s2 (not illustrated in FIG. 3A), the parallel arm resonators p1 and p2 (not illustrated in FIG. 3A), the input/output terminals 110 (not illustrated in FIG. 3A) and 120, and ground terminals 130 and 140 which are provided on the substrate 70. The ground terminal 130 (first ground terminal) and the ground terminal 140 (second ground terminal) are separated from each other on the substrate 70.

The input/output terminals 110 (not illustrated in FIG. 3A) and 120 and the ground terminals 130 and 140 are preferably provided in an outer peripheral region on the substrate 70, and are made of, for example, the same electrode material as the IDT electrodes defining the longitudinally coupled resonator 11, the series arm resonators s1 and s2, and the parallel arm resonators p1 and p2.

The signal wiring 50H1 connects one of the pair of comb-shaped electrodes included in each of the IDT electrodes 51, 53, and 55 of the longitudinally coupled resonator 11 and the series arm resonator s2 (node N1 in FIG. 3A). The signal wiring 50H2 connects one of the pair of comb-shaped electrodes included in each of the IDT electrodes 52 and 54 of the longitudinally coupled resonator 11 and the input/output terminal 120.

The ground wiring 50GR connects the other of the pair of comb-shaped electrodes included in the IDT electrode 51 (first IDT electrode) arranged at a position closest to the input/output terminal 120 among the IDT electrodes 51 to 55, and the reflector 56L to the ground terminal 140. That is, the other of the pair of comb-shaped electrodes included in the IDT electrode 51 is connected to the ground terminal 140 on the substrate 70.

The ground wiring 50GC connects the other of the pair of comb-shaped electrodes included in each of all the IDT electrodes 52 to 55 except for the IDT electrode 51 (first IDT electrode) arranged at a position closest to the input/output terminal 120 among the IDT electrodes 51 to 55, and the reflector 56R to the ground terminal 130. That is, the other of the pair of comb-shaped electrodes included in each of the IDT electrodes 52 to 55 is connected to the ground terminal 130 on the substrate 70.

In an acoustic wave filter including an existing longitudinally coupled resonator, a spurious response caused by a resonant mode of the longitudinally coupled resonator occurs on a higher frequency side than a pass band. For this reason, there is a problem that it is impossible to secure an attenuation on a higher frequency side than a pass band.

On the other hand, with the configuration of the acoustic wave filter 10 according to the present preferred embodiment, among the plurality of IDT electrodes 51 to 55 that define the longitudinally coupled resonator 11, the ground terminal 140 connected to the IDT electrode 51 closest to the input/output terminal 120 is separated from the ground terminal 130 connected to the other IDT electrodes 52 to 55, and the ground terminal 130 connected to the other IDT electrodes 52 to 55 is made common. By separating the ground terminal 140 connected to the IDT electrode 51 from the ground terminal 130 of the other IDT electrodes 52 to 55, it is possible to increase an inductance value between the longitudinally coupled resonator 11 and the ground, and to shift the attenuation pole that is on the higher frequency side than the pass band and is generated due to the longitudinally coupled resonator 11, to the lower frequency side. This makes it possible to improve the attenuation in the vicinity of the high frequency side of the pass band of the acoustic wave filter 10.

It should be noted that the ground terminal 140 connected to the IDT electrode 51 closest to the input/output terminal 120, of the ground terminals 130 and 140, is preferably closer to the input/output terminal 120. Accordingly, since the ground wiring 50GR can be made short, the inductance value between the longitudinally coupled resonator 11 and the ground can be further increased.

Note that, as illustrated in FIG. 3A, there is a region where the signal wirings 50H1 and 50H2 overlap the ground wiring 50GC, and in this region, the signal wirings 50H1 and 50H2 and the ground line 50GC are laminated with the dielectric layer interposed therebetween. Also, FIG. 3A illustrates a configuration in which (1) the substrate 70, (2) the signal wirings 50H1 and 50H2, (3) the dielectric layer, and (4) the ground wiring 50GC are laminated in this order in the region, but (1) the substrate 70, (2) the ground wiring 50GC, (3) the dielectric layer, and (4) the signal wirings 50H1 and 50H2 may be laminated in this order.

In addition, as illustrated in FIG. 3B, in the vicinity of the input/output terminal 120, the signal wiring 50H2 and the ground wiring 50GR do not intersect with each other on the substrate 70. That is, one of the pair of comb-shaped electrodes included in the IDT electrode 51 is connected to the signal wiring 50H1 on the side of the input/output terminal 110, and the signal wiring 50H2 between the input/output terminal 120 and one of the pair of comb-shaped electrodes included in the IDT electrode 52 (second IDT electrode) arranged at a position next closest to the input/output terminal 120 and subsequent to the IDT electrode 51 does not overlap the ground wirings 50GR and 50GC in the vicinity of the input/output terminal 120.

According to this, the signal wiring 50H2 and the ground wirings 50GR and 50GC do not need to have a three-dimensional wiring structure with a dielectric layer interposed therebetween. Therefore, it is possible to improve the insertion loss in the pass band of the acoustic wave filter 10 because the parasitic capacitance of the wiring that propagates a radio frequency signal can be reduced.

1-2. Configuration of Acoustic Wave Filter 510 according to Comparative Example Here, a configuration of an existing acoustic wave filter and a problem thereof will be described.

Figure 4:
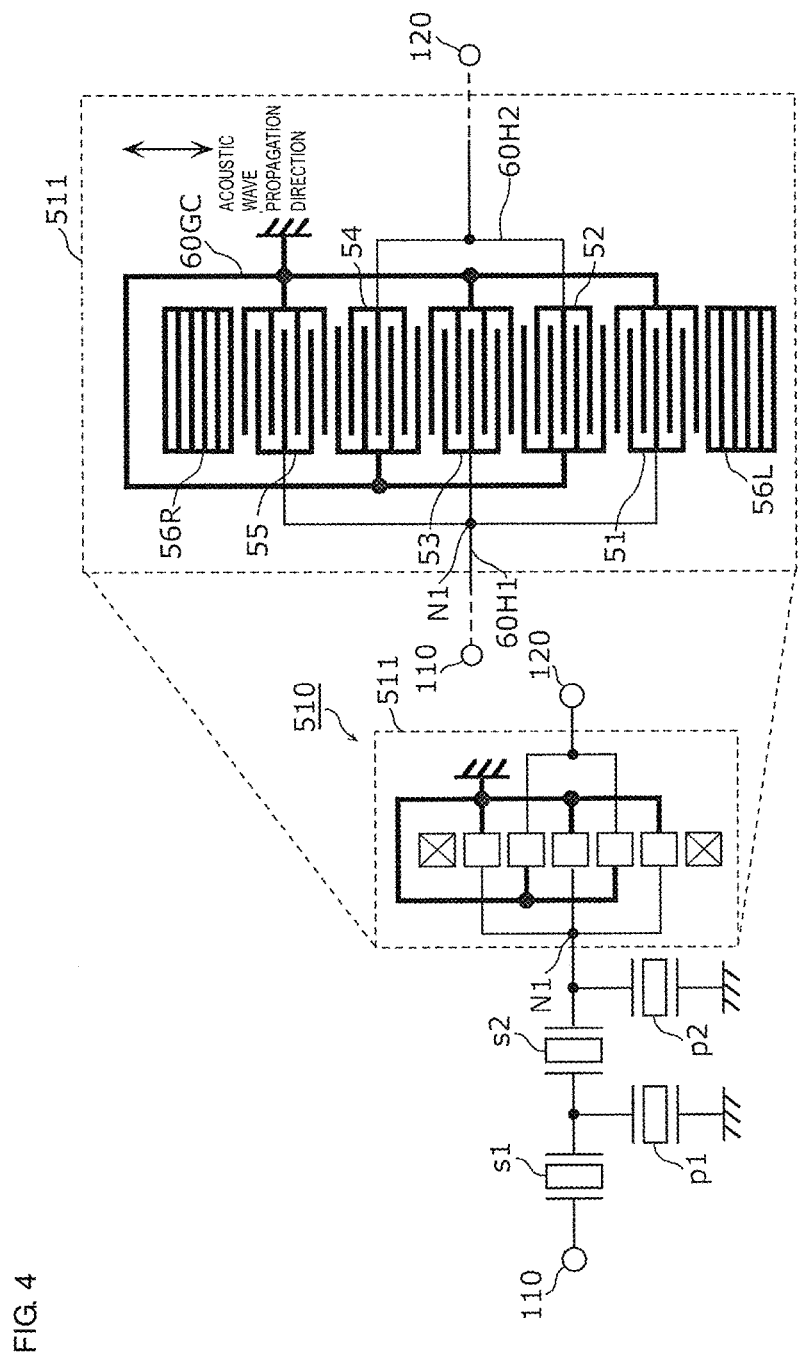
FIG. 4 is a circuit configuration diagram of an acoustic wave filter according to a comparative example.

FIG. 4 is a circuit configuration diagram of an acoustic wave filter 510 according to a comparative example. As illustrated in FIG. 4, the acoustic wave filter 510 includes a longitudinally coupled resonator 511, the series arm resonators s1 and s2, the parallel arm resonators p1 and p2, and the input/output terminals 110 and 120. The acoustic wave filter 510 according to the comparative example differs from the acoustic wave filter 10 according to the first preferred embodiment only in a configuration of ground connection of IDT electrodes included in the longitudinally coupled resonator 511. Hereinafter, the acoustic wave filter 510 according to the comparative example will be described focusing on differences from the acoustic wave filter 10 according to the first preferred embodiment.

In each of the IDT electrodes 51 to 55, one of the pair of comb-shaped electrodes is connected to a signal wiring 60H1 or 60H2 on the path connecting the input/output terminal 110 and the input/output terminal 120, and the other of the pair of comb-shaped electrodes is connected to a ground wiring 60GC. More specifically, one of the pair of comb-shaped electrodes included in each of the IDT electrodes 51, 53, and 55 arranged at odd-numbered positions from a side of the reflector 56L is connected to the signal wiring 60H1 on the side of the input/output terminal 110. Further, one of the pair of comb-shaped electrodes included in each of the IDT electrodes 52 and 54 arranged at even-numbered positions from a side of the reflector 56L is connected to the signal wiring 60H2 on the side of the input/output terminal 120. Further, the other of the pair of comb-shaped electrodes included in each of the IDT electrodes 51 to 55 is connected to the ground wiring 60GC.

With the above-described configuration, the longitudinally coupled resonator 511 mainly defines an insertion loss in a pass band of the acoustic wave filter 510 and an attenuation in a vicinity of the pass band.

Figure 5A:
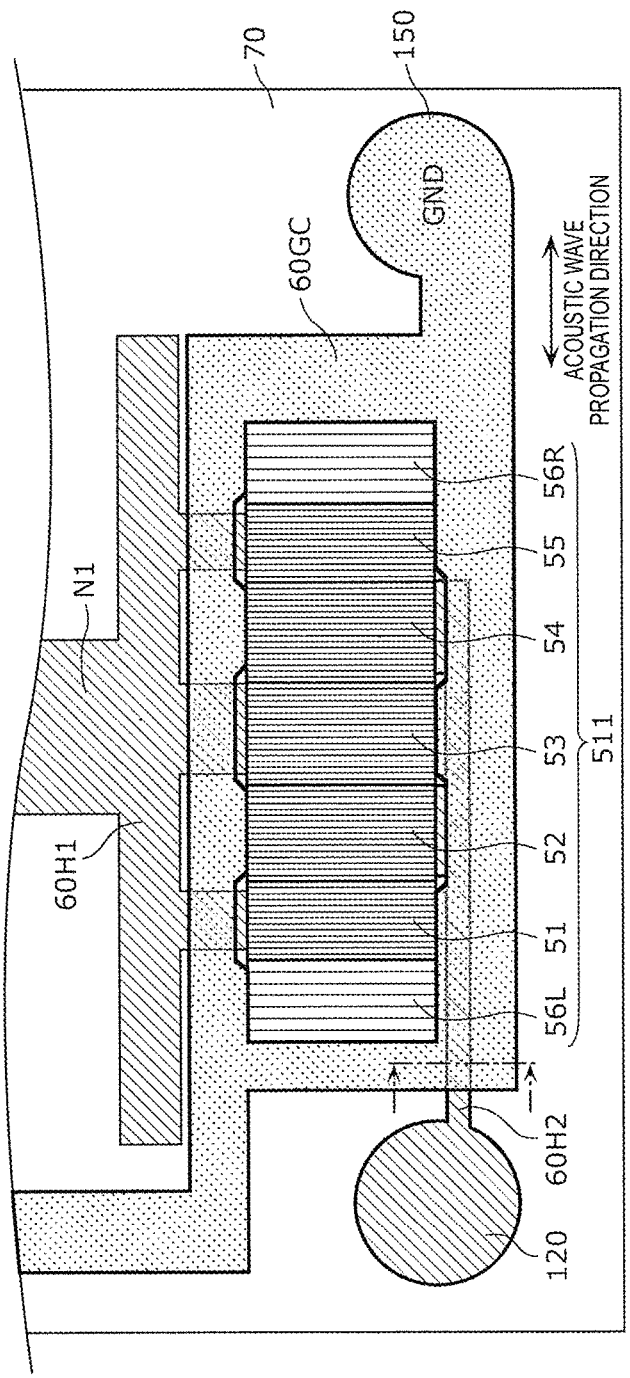
FIG. 5A is a plan view illustrating an electrode layout of a longitudinally coupled resonator of the acoustic wave filter according to the comparative example.
Figure 5B:
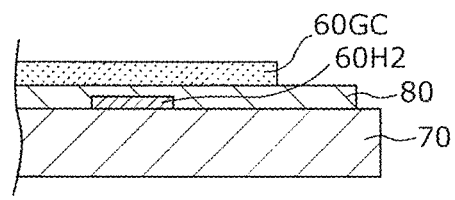
FIG. 5B is a cross-sectional view in a vicinity of an input/output terminal of the acoustic wave filter according to the comparative example.

FIG. 5A is a plan view illustrating an electrode layout of the longitudinally coupled resonator 511 of the acoustic wave filter 510 according to the comparative example. Further, FIG. 5B is a cross-sectional view in a vicinity of the input/output terminal 120 of the acoustic wave filter 510 according to the comparative example.

FIG. 5A illustrates the electrode layout of the longitudinally coupled resonator 511 configuring the acoustic wave filter 510. As illustrated in FIG. 5A, the acoustic wave filter 510 includes the substrate 70 having piezoelectricity, the longitudinally coupled resonator 511, the series arm resonators s1 and s2 (not illustrated in FIG. 5A), the parallel arm resonators p1 and p2 (not illustrated in FIG. 5A), the input/output terminals 110 (not illustrated in FIG. 5A) and 120, and a ground terminal 150 that are provided on the substrate 70.

The input/output terminal 110 (not illustrated in FIG. 5A) and 120, and the ground terminal 150 are provided in an outer peripheral region on the substrate 70.

The signal wiring 60H1 connects one of the pair of comb-shaped electrodes included in each of the IDT electrodes 51, 53, and 55 of the longitudinally coupled resonator 511 and the series arm resonator s2 (node N1 in FIG. 5A). The signal wiring 60H2 connects one of the pair of comb-shaped electrodes included in each of the IDT electrodes 52 and 54 of the longitudinally coupled resonator 511 and the input/output terminal 120.

The ground wiring 60GC connects the other of the pair of comb-shaped electrodes included in each of the IDT electrodes 51 to 55, the reflectors 56R and 56L, and the ground terminal 150. That is, in a plan view of the substrate 70, the other of the pair of comb-shaped electrodes included in each of the IDT electrodes 51 to 55 is connected to the ground terminal 150.

In the acoustic wave filter 510 including the longitudinally coupled resonator 511 according to the comparative example, a spurious response caused by a resonant mode of the longitudinally coupled resonator 511 is generated on a higher frequency side than a pass band. For this reason, there is a problem that it is impossible to secure an attenuation on the higher frequency side than the pass band. In the acoustic wave filter 510 according to the comparative example, the ground of the IDT electrodes 51 to 55 is made common on the substrate 70 in order to achieve miniaturization and ground reinforcement, but when the ground of the IDT electrodes 51 to 55 is made common as illustrated in FIG.

5B, the signal wiring 60H2 and the ground wiring 60GC are laminated with a dielectric layer 80 interposed therebetween in the vicinity of the input/output terminal 120, and an unnecessary capacitance component and an unnecessary resistance component are generated. In particular, when the unnecessary capacitance component and the unnecessary resistance component are generated in the vicinity of the input/output terminal, the deterioration of the bandpass characteristics and the attenuation characteristics of the acoustic wave filter becomes significant.

On the other hand, according to the configuration of the acoustic wave filter 10 according to the present preferred embodiment, among the plurality of IDT electrodes 51 to 55 that define the longitudinally coupled resonator 11, the ground terminal 140 connected to the IDT electrode 51 closest to the input/output terminal 120 is separated from the ground terminal 130 connected to the other IDT electrodes 52 to 55, and the ground terminal 130 connected to the other IDT electrodes 52 to 55 is made common. By separating the ground terminal 140 connected to the IDT electrode 51 from the ground terminal 130 of the other IDT electrodes 52 to 55, it is possible to increase an inductance value between the longitudinally coupled resonator 11 and the ground, and to shift the attenuation pole that is on the higher frequency side than the pass band and is generated due to the longitudinally coupled resonator 11, to the lower frequency side. This makes it possible to improve the attenuation in the vicinity of the high frequency side of the pass band of the acoustic wave filter 10.

Second Preferred Embodiment 2-1. Configuration of Multiplexer 1

In the present preferred embodiment, a multiplexer 1 including the acoustic wave filter 10 according to the first preferred embodiment will be described.

Figure 6:
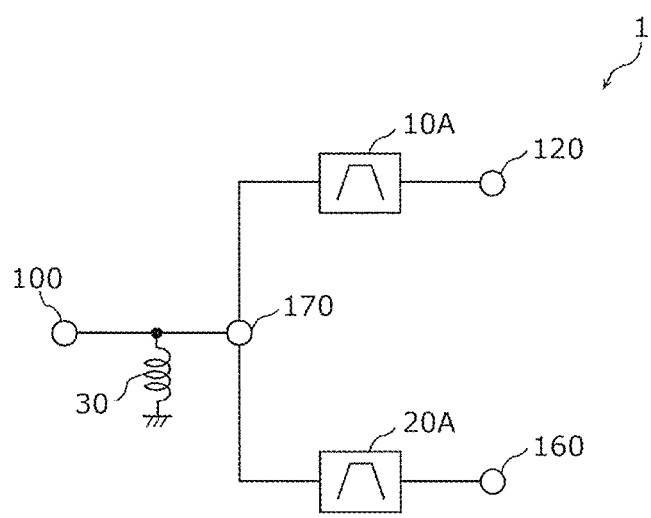
FIG. 6 is a circuit configuration diagram of a multiplexer according to a second preferred embodiment of the present invention.

FIG. 6 is a circuit configuration diagram of the multiplexer 1 according to a second preferred embodiment of the present invention. As illustrated in FIG. 6, the multiplexer 1 includes a reception-side filter 10A, a transmission-side filter 20A, a common terminal 170, the input/output terminal 120 and an input/output terminal 160, and an inductor 30. The multiplexer 1 is connected to, for example, an antenna element at an antenna terminal 100. The inductor 30 providing impedance matching is connected between a path connecting the antenna terminal 100 and the common terminal 170 and a ground defining and functioning as a reference terminal. Note that the inductor 30 may be connected in series to the path. Alternatively, the multiplexer 1 may have a configuration in which the inductor 30 is not provided. In addition, the inductor 30 may be configured to be included in the multiplexer 1, or may be externally attached to the multiplexer 1.

The reception-side filter 10A is the acoustic wave filter 10 according to the first preferred embodiment, and is the first filter that is connected between the common terminal 170 and the input/output terminal 120 (first terminal), that inputs a reception wave input from the common terminal 170, and that filters the reception wave in a reception pass band of BandA to output the reception wave to the input/output terminal 120.

The transmission-side filter 20A is the second filter that is connected between the common terminal 170 and the input/output terminal 160 (second terminal), that inputs a transmission wave generated by a transmission circuit (RFIC or the like) via the input/output terminal 160, and that filters the transmission wave in a transmission pass band of BandA to output the transmission wave to the common terminal 170. The configuration of the transmission-side filter 20A is not particularly limited, and for example, an acoustic wave filter may be used, and an LC filter including an inductor and a capacitor may be used.

Note that in the multiplexer 1 according to the present preferred embodiment, the transmission pass band of the transmission-side filter 20A is positioned on a higher frequency side with respect to the reception pass band of the reception-side filter 10A.

At least one of an impedance element and a capacitance element providing impedance matching may be connected between the common terminal 170 and each of the filters.

2-2. Radio Frequency Propagation Characteristics of Multiplexer 1

Figure 7:
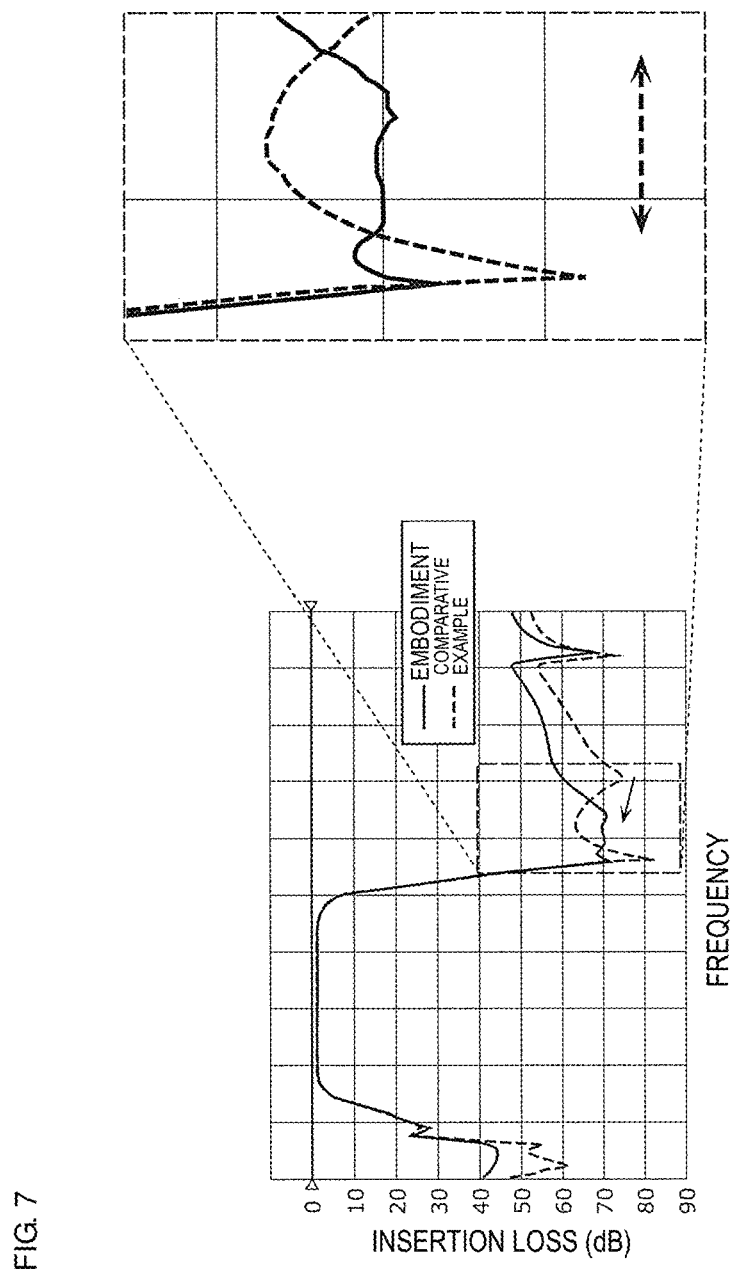
FIG. 7 is a graph comparing bandpass characteristics of an acoustic wave filter according to the second preferred embodiment and the acoustic wave filter according to the comparative example.
Figure 8:
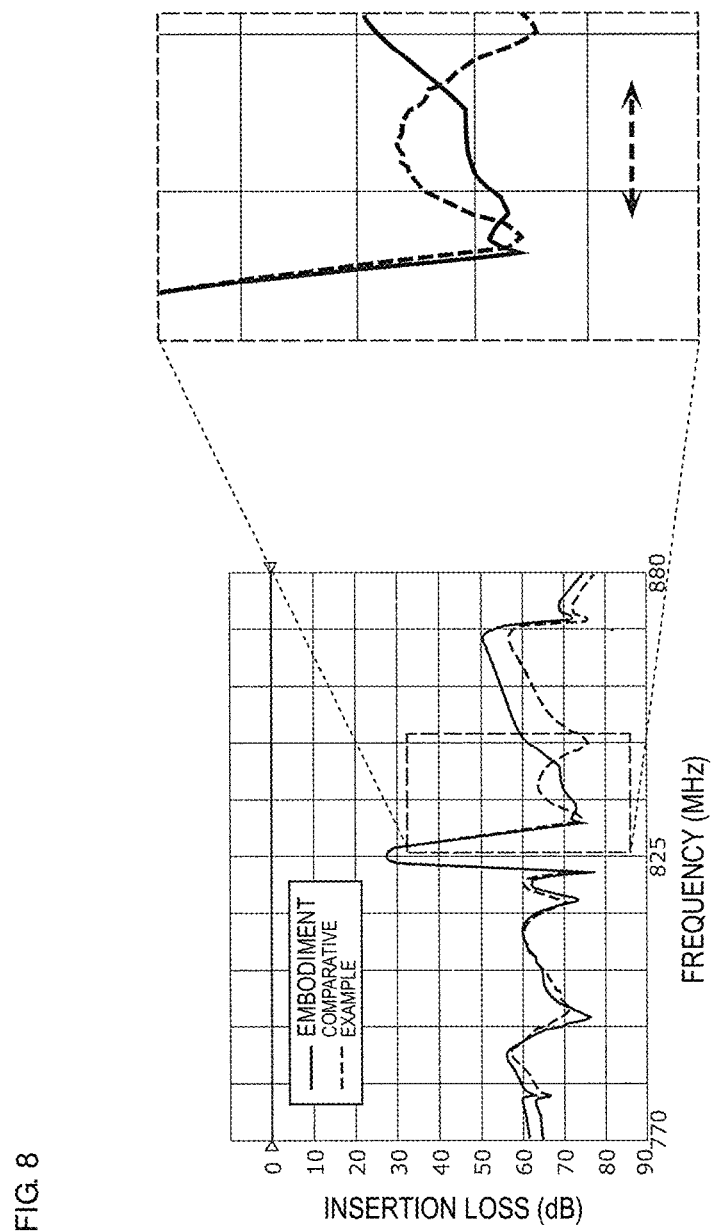
FIG. 8 is a graph comparing isolation characteristics of the multiplexer according to the second preferred embodiment of the present invention and a multiplexer according to the comparative example.

FIG. 7 is a graph comparing bandpass characteristics of the reception-side filter of the multiplexer according to the second preferred embodiment and a reception-side filter of a multiplexer according to the comparative example. FIG. 8 is a graph comparing isolation characteristics of the multiplexers according to the second preferred embodiment and the comparative example.

Note that the multiplexer according to the comparative example has a configuration in which the acoustic wave filter 510 according to the comparative example is used for the reception-side filter in the configuration of the multiplexer illustrated in FIG. 6.

In FIG. 7, a difference between insertion losses in the pass band of the reception-side filters defining the multiplexers in the second preferred embodiment and the comparative example is only barely seen, if at all.

On the other hand, in the attenuation band that is in a vicinity of on the high frequency side of the pass band of the reception-side filters, the attenuation of the reception-side filter 10A according to the second preferred embodiment is improved compared to that of the reception-side filter according to the comparative example. Therefore, when the attenuation band is included in the transmission pass band of the transmission-side filters, the insertion loss of the transmission-side filter 20A according to the second preferred embodiment is improved compared to that of the transmission-side filter according to the comparative example.

Note that similar measurement results to those in FIG. 7 are obtained even when pass band characteristics of the acoustic wave filter 10 according to the first preferred embodiment and the acoustic wave filter 510 according to the comparative example are individually measured. That is, in the attenuation band that is in the vicinity on the high frequency side of the pass band of the acoustic wave filter 10, the attenuation of the acoustic wave filter 10 according to the first preferred embodiment is improved compared to that of the acoustic wave filter 510 according to the comparative example.

Further, as illustrated in FIG. 8, the attenuation in the attenuation band of the reception-side filter 10A is improved, so that the isolation between the reception-side filter 10A and the transmission-side filter 20A in the attenuation band is improved.

According to the configuration of the multiplexer 1 according to the present preferred embodiment, among the plurality of IDT electrodes 51 to 55 defining the longitudinally coupled resonator 11 of the reception-side filter 10A, the ground terminal 140 connected to the IDT electrode 51 closest to the input/output terminal 120 is separated from the ground terminal 130 connected to the other IDT electrodes 52 to 55, and the ground terminal 130 connected to the other IDT electrodes 52 to 55 is made common. By separating the ground terminal 140 connected to the IDT electrode from the ground terminal 130 connected to the other IDT electrodes 52 to 55, the inductance value between the longitudinally coupled resonator 11 and the ground can be increased, and the attenuation pole that is in the attenuation band and that is generated due to the longitudinally coupled resonator 11 can be shifted to the lower frequency side (the arrow in FIG. 7). This makes it possible to improve the attenuation in the vicinity on the high-frequency side of the reception pass band of the reception-side filter 10A, and also to improve the insertion loss of the transmission-side filter 20A. Furthermore, it is possible to improve the isolation characteristics in the pass band of the transmission-side filter 20A of the multiplexer 1.

Note that the transmission-side filter 20A may be provided on the substrate 70 on which the reception-side filter 10A is provided. Accordingly, since the multiplexer 1 can be provided on one substrate, the multiplexer 1 can be reduced in size.

Note that, in the multiplexer 1 according to the present preferred embodiment, a duplexer in which the reception-side filter 10A and the transmission-side filter 20A are connected to the common terminal has been exemplified, but the multiplexer according to the present invention is not limited to a configuration including both a transmission-side filter and a reception-side filter, and a configuration including only a plurality of transmission-side filters or only a plurality of reception-side filters may be applicable.

Moreover, the multiplexer according to the present invention can also be applied to, for example, a triplexer in which three filters are connected to a common terminal, a quadplexer in which two duplexers are commonly connected by a common terminal, or the like. That is, the multiplexer according to the present invention is only required to include two or more filters.

Third Preferred Embodiment

The multiplexer 1 according to the second preferred embodiment may be applied to a radio frequency front-end circuit, and further to a communication device including the radio frequency front-end circuit. Therefore, in the present preferred embodiment, such a radio frequency front-end circuit and a communication device will be described.

Figure 9:
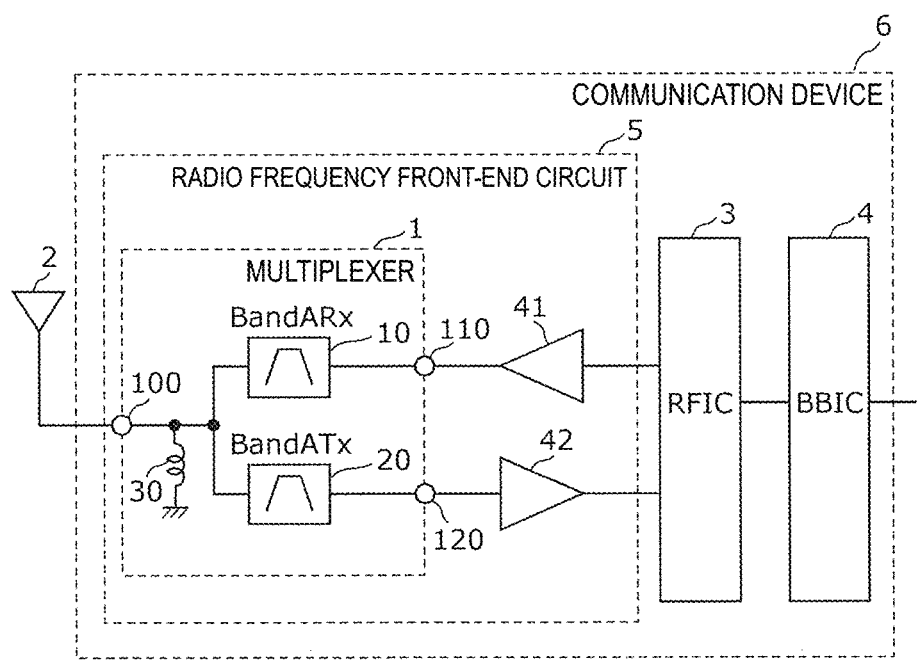
FIG. 9 is a configuration diagram of a communication device according to a third preferred embodiment of the present invention.

FIG. 9 is a configuration diagram of a communication device 6 according to the third preferred embodiment of the present invention. The communication device 6 includes a radio frequency front-end circuit 5, an RF signal processing circuit 3, and a baseband signal processing circuit 4. Note that an antenna element 2 connected to the communication device 6 is also illustrated in FIG. 9.

The radio frequency front-end circuit 5 includes the multiplexer 1, a power amplifier circuit 41, and a low noise amplifier circuit 42.

As the multiplexer 1, the multiplexer according to the second preferred embodiment is used.

The power amplifier circuit 41 is preferably a transmission amplifier circuit that amplifies a radio frequency signal (here, a radio frequency transmission signal) output from the RF signal processing circuit 3 and that outputs the amplified radio frequency signal to the antenna element 2 via the multiplexer 1.

The low noise amplifier circuit 42 is preferably a reception amplifier circuit that amplifies a radio frequency signal (here, a radio frequency reception signal) that has passed through the antenna element 2 and the multiplexer 1, and that outputs the amplified radio frequency signal to the RF signal processing circuit 3.

The RF signal processing circuit 3 performs signal processing on a radio frequency reception signal input from the antenna element 2 via a reception signal path by down-conversion or the like, and outputs the reception signal generated by the signal processing to the baseband signal processing circuit 4. In addition, the RF signal processing circuit 3 performs signal processing on a transmission signal input from the baseband signal processing circuit 4 by up-conversion or the like, and outputs the radio frequency transmission signal generated by the signal processing to the power amplifier circuit 41. The RF signal processing circuit 3 is preferably, for example, an RFIC.

The signal processed by the baseband signal processing circuit 4 is used, for example, for image display as an image signal, or for a phone call as an audio signal.

Note that the radio frequency front-end circuit 5 may include another circuit element between the above-described constituent elements.

According to the above configuration, by providing the multiplexer 1, it is possible to improve the attenuation in the vicinity on the high frequency side of the pass band of the reception-side filter 10A, and to reduce or prevent the degradation of the insertion loss of the transmission-side filter 20A, and thus it is possible to provide the radio frequency front-end circuit 5 and the communication device 6 in which the bandpass characteristics of the multiplexer 1 are improved.

Note that the communication device 6 may not include the baseband signal processing circuit (BBIC) 4 according to processing scheme of a radio frequency signal.

Further, the multiplexer 1 included in the radio frequency front-end circuit 5 may be, for example, a triplexer, a quadplexer, a hexaplexer, or the like including three or more filters. In that case, a switch circuit is appropriately arranged between the multiplexer and each of the power amplifier circuit 41 and the low noise amplifier circuit 42.

The acoustic wave filter 10 according to the first preferred embodiment, the multiplexer 1 according to the second preferred embodiment, and the radio frequency front-end circuit 5 and the communication device 6 according to the third preferred embodiment have been described above with reference to preferred embodiments, but the present invention is not limited to the above-described preferred embodiments. For example, aspects in which the above-described preferred embodiments are modified may also be included in the present invention.

For example, in the second preferred embodiment, a configuration has been described in which the reception pass band of the reception-side filter 10A (first filter) is preferably on the low frequency side and the transmission pass band of the transmission-side filter 20A (second filter) is on the high frequency side, but the pass band on low frequency side assigned to the first filter and the pass band on high frequency side assigned to the second filter may be opposite to each other. Even in this case, it is possible to improve the attenuation in the attenuation band in the vicinity on the high frequency side of the pass band of the first filter.

The present invention can be widely used as a transmission and reception filter and a multiplexer for use in a front-end of a wireless communication terminal for which low loss inside a pass band and high attenuation outside the pass band are required.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
a substrate having piezoelectricity;
a first input/output terminal and a second input/output terminal on the substrate;
a first ground terminal and a second ground terminal on the substrate and separated from each other on the substrate; and
a longitudinally coupled resonator on the substrate and arranged on a path connecting the first input/output terminal and the second input/output terminal; wherein
the longitudinally coupled resonator includes three or more Interdigital Transducer (IDT) electrodes arranged side by side in a direction in which a predetermined acoustic wave propagates on the substrate;
each of the three or more IDT electrodes includes a pair of comb-shaped electrodes each of which includes a plurality of electrode fingers extending in an intersecting direction with the direction, and a busbar electrode connecting one end of each of the electrode fingers of the plurality of electrode fingers to each other;
the pair of comb-shaped electrodes oppose each other such that the plurality of electrode fingers is interdigitated with each other, and one of the pair of comb-shaped electrodes is connected to the path;
another one of the pair of comb-shaped electrodes included in a first IDT electrode which is an IDT electrode arranged at a position closest to the second input/output terminal, among the three or more IDT electrodes, is connected to the second ground terminal on the substrate; and
the another of the pair of comb-shaped electrodes included in each of the IDT electrodes other than the first IDT electrode, among the three or more IDT electrodes, is connected to the first ground terminal on the substrate.

2. The acoustic wave filter according to claim 1, wherein one of the pair of comb-shaped electrodes included in the first IDT electrode is connected to a path on a side of the first input/output terminal of the first input/output terminal and the second input/output terminal; and
a wiring connecting one of the pair of comb-shaped electrodes included in a second IDT electrode that is an IDT electrode arranged at a position next closest to the second input/output terminal and subsequent to the first IDT electrode among the three or more IDT electrodes and the second input/output terminal is not overlapped with a wiring connecting another of the pair of comb-shaped electrodes included in the first IDT electrode and the second ground terminal, and a wiring connecting the other of the pair of comb-shaped electrodes included in each of the IDT electrodes other than the first IDT electrode among the three or more IDT electrodes and the first ground terminal.

3. The acoustic wave filter according to claim 1, further comprising:
one or more series arm resonators arranged on the path; and
one or more parallel arm resonators arranged between a node on the path and a ground.

4. A multiplexer comprising: a common terminal; a first terminal and a second terminal; a first filter connected between the common terminal and the first terminal; and a second filter connected between the common terminal and the second terminal; wherein the first filter is the acoustic wave filter of claim 1; and a pass band of the second filter is positioned on a higher frequency side with respect to a pass band of the first filter.

5. The multiplexer according to claim 4, wherein
the second filter is a transmission-side filter on the substrate;
the first filter is a reception-side filter;
the common terminal is the first input/output terminal; and
the first terminal is the second input/output terminal.

6. A radio frequency front-end circuit comprising: the multiplexer of claim 4; and an amplifier circuit connected to the multiplexer.

7. A communication device comprising: a Radio Frequency (RF) signal processing circuit to process a radio frequency signal to be transmitted and received with an antenna element; and the radio frequency front-end circuit of claim 6 to transfer the radio frequency signal between the antenna element and the RF signal processing circuit.

8. The acoustic wave filter according to claim 1, further comprising:
a pair of reflectors; wherein
the three or more IDT electrodes are sandwiched between the pair of reflectors.

9. The acoustic wave filter according to claim 3, wherein the one or more series arm resonators and the one or more parallel arm resonators are acoustic wave resonators.

10. The acoustic wave filter according to claim 1, wherein each of the three or more IDT electrodes has a laminated structure including a close contact layer and a main electrode layer.

11. The acoustic wave filter according to claim 10, further comprising a protective layer covering each of the three or more IDT electrodes.

12. The acoustic wave filter according to claim 1, wherein the substrate includes a high acoustic velocity support substrate, a low acoustic velocity film, and a piezoelectric film.

13. The acoustic wave filter according to claim 1, wherein the first input/output terminal and the second input/output terminal are provided at an outer peripheral region of the substrate.

14. The acoustic wave filter according to claim 1, wherein the first input/output terminal, the second input/output terminal, and the three or more IDT electrodes are made of a same material.

* * * * *